United States Patent
Guyette et al.

(10) Patent No.: US 11,955,951 B2
(45) Date of Patent: *Apr. 9, 2024

(54) TRANSVERSELY-EXCITED FILM BULK ACOUSTIC RESONATOR MATRIX FILTERS WITH SWITCHES IN PARALLEL WITH SUB-FILTER SHUNT CAPACITORS

(71) Applicant: Murata Manufacturing Co., Ltd., Nagaokakyo (JP)

(72) Inventors: Andrew Guyette, San Mateo, CA (US); Neal Fenzi, Santa Barbara, CA (US); Michael Eddy, Santa Barbara, CA (US); Bryant Garcia, Belmont, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/948,170

(22) Filed: Sep. 19, 2022

(65) Prior Publication Data

US 2023/0010788 A1 Jan. 12, 2023

Related U.S. Application Data

(63) Continuation of application No. 17/373,427, filed on Jul. 12, 2021, now Pat. No. 11,476,834, which is a
(Continued)

(51) Int. Cl.
*H03H 9/56* (2006.01)
*H03H 9/17* (2006.01)
*H03H 9/54* (2006.01)

(52) U.S. Cl.
CPC .............. *H03H 9/568* (2013.01); *H03H 9/17* (2013.01); *H03H 9/542* (2013.01)

(58) Field of Classification Search
CPC .......... H03H 9/568; H03H 9/17; H03H 9/542; H03H 9/174; H03H 9/564; H03H 9/706; H03H 9/0228
See application file for complete search history.

(56) References Cited

U.S. PATENT DOCUMENTS

| 5,189,777 A | 3/1993 | Guckel et al. |
| 5,204,575 A | 4/1993 | Kanda et al. |
| (Continued) | | |

FOREIGN PATENT DOCUMENTS

| CN | 209017001 A | 6/2019 |
| CN | 209608623 U | 11/2019 |
| (Continued) | | |

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

(Continued)

*Primary Examiner* — Andrea Lindgren Baltzell
*Assistant Examiner* — Kimberly E Glenn
(74) *Attorney, Agent, or Firm* — ARENTFOX SCHIFF LLP

(57) ABSTRACT

There are disclosed matrix filters having an input port and sub-filters connected between the input port and respective output ports. Each of the sub-filters includes a ladder circuit with n transversely-excited film bulk acoustic resonator (XBAR) series elements and n−1 capacitor shunt elements, where n, the order of the sub-filter, is an integer greater than 2. Each sub-filter further has a first switch in parallel with a first capacitor shunt element and a second switch in parallel with a last capacitor shunt element.

20 Claims, 12 Drawing Sheets

Related U.S. Application Data continuation-in-part of application No. 17/372,114, filed on Jul. 9, 2021, which is a continuation-in-part of application No. 17/122,986, filed on Dec. 15, 2020, now Pat. No. 11,309,865, which is a continuation-in-part of application No. 17/121,724, filed on Dec. 14, 2020, now Pat. No. 11,405,017.

(60) Provisional application No. 63/180,084, filed on Apr. 27, 2021, provisional application No. 63/087,789, filed on Oct. 5, 2020.

(56) References Cited

U.S. PATENT DOCUMENTS

| | | |
|---|---|---|
| 5,274,345 A | 12/1993 | Gau |
| 5,281,934 A | 1/1994 | Shiau et al. |
| 5,446,330 A | 8/1995 | Eda et al. |
| 5,552,655 A | 9/1996 | Stokes et al. |
| 5,654,680 A | 8/1997 | Kwan et al. |
| 5,726,610 A | 3/1998 | Allen et al. |
| 5,729,186 A | 3/1998 | Seki et al. |
| 5,853,601 A | 12/1998 | Krishaswamy |
| 5,952,899 A | 9/1999 | Kadota et al. |
| 6,172,582 B1 | 1/2001 | Hickernell |
| 6,271,617 B1 | 8/2001 | Yoneda et al. |
| 6,377,140 B1 | 4/2002 | Ehara et al. |
| 6,452,909 B1 | 9/2002 | Bauer |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,724,278 B1 | 4/2004 | Smith |
| 6,833,774 B2 | 12/2004 | Abbott et al. |
| 7,009,468 B2 | 3/2006 | Kadota et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,391,650 B2 | 7/2016 | Aparin |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,389,332 B2 | 8/2019 | Bhattacharjee |
| 10,476,469 B2 | 11/2019 | Gong et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 11,201,601 B2 | 12/2021 | Yantchev et al. |
| 11,206,009 B2 | 12/2021 | Plesski |
| 11,228,296 B2 | 1/2022 | Dyer |
| 11,239,816 B1 | 2/2022 | McHugh |
| 11,239,822 B2 | 2/2022 | Garcia |
| 11,264,966 B2 | 3/2022 | Yantchev |
| 11,264,969 B1 | 3/2022 | Fenzi |
| 11,271,539 B1 | 3/2022 | Yantchev |
| 11,271,540 B1 | 3/2022 | Yantchev |
| 11,283,424 B2 | 3/2022 | Turner |
| 11,309,865 B1 | 4/2022 | Guyette |
| 11,323,089 B2 | 5/2022 | Turner |
| 11,323,090 B2 | 5/2022 | Garcia |
| 11,323,091 B2 | 5/2022 | Kay |
| 11,323,095 B2 | 5/2022 | Garcia |
| 11,323,096 B2 | 5/2022 | Yantchev |
| 11,349,450 B2 | 5/2022 | Yantchev |
| 11,349,452 B2 | 5/2022 | Yantchev |
| 11,356,077 B2 | 6/2022 | Garcia |
| 11,368,139 B2 | 6/2022 | Garcia |
| 11,374,549 B2 | 6/2022 | Yantchev |
| 11,381,221 B2 | 7/2022 | McHugh |
| 11,405,017 B2 | 8/2022 | Guyette et al. |
| 11,476,834 B2 * | 10/2022 | Guyette ................ H03H 9/706 |
| 2002/0079986 A1 | 6/2002 | Ruby et al. |
| 2002/0130736 A1 | 9/2002 | Mukai |
| 2002/0153970 A1 | 10/2002 | Noto |
| 2002/0158714 A1 | 10/2002 | Kaitila et al. |
| 2002/0189062 A1 | 12/2002 | Lin et al. |
| 2002/0190814 A1 | 12/2002 | Yamada et al. |
| 2003/0042998 A1 | 3/2003 | Edmonson |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0130410 A1 | 7/2004 | Nishimura et al. |
| 2004/0140866 A1 | 7/2004 | Taniguchi |
| 2004/0233020 A1 | 11/2004 | Nakamura |
| 2004/0261250 A1 | 12/2004 | Kadota et al. |
| 2005/0077982 A1 | 4/2005 | Funasaka |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0055485 A1 | 3/2006 | Lobeek |
| 2006/0152107 A1 | 7/2006 | Tanaka |

(56) References Cited

U.S. PATENT DOCUMENTS

| | | |
|---|---|---|
| 2006/0179642 A1 | 8/2006 | Kawamura |
| 2007/0030096 A1 | 2/2007 | Nichihara et al. |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2008/0309430 A1 | 12/2008 | Tsuzuki et al. |
| 2010/0019866 A1 | 1/2010 | Hara et al. |
| 2010/0064492 A1 | 3/2010 | Tanaka |
| 2010/0117483 A1 | 5/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0254406 A1 | 10/2011 | Yamane |
| 2011/0278993 A1 | 11/2011 | Iwamoto |
| 2012/0073390 A1 | 3/2012 | Zaghloul et al. |
| 2012/0198672 A1 | 8/2012 | Ueda et al. |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2014/0340173 A1 | 11/2014 | Burgener et al. |
| 2015/0014795 A1 | 1/2015 | Franosch |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182008 A1 | 6/2016 | Bhattacharjee |
| 2016/0182009 A1 | 6/2016 | Bhattacharjee |
| 2017/0063332 A1 | 3/2017 | Gilbert et al. |
| 2017/0070405 A1 | 3/2017 | Hashemi et al. |
| 2017/0155373 A1 | 6/2017 | Ruby |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0262179 A1 | 9/2018 | Goto |
| 2018/0278227 A1 | 9/2018 | Hurwitz |
| 2018/0309426 A1 | 10/2018 | Guenard |
| 2019/0044498 A1 | 2/2019 | Kawasaki |
| 2019/0068164 A1 | 2/2019 | Houlden et al. |
| 2019/0123721 A1 | 4/2019 | Takamine |
| 2019/0131953 A1 | 5/2019 | Gong |
| 2019/0181832 A1 | 6/2019 | Schmalzl et al. |
| 2019/0190487 A1 | 6/2019 | Yasuda |
| 2019/0245509 A1 | 8/2019 | Hurwitz |
| 2019/0245518 A1 | 8/2019 | Ito |
| 2019/0253038 A1 | 8/2019 | Houlden |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0028481 A1 | 1/2020 | Sun et al. |
| 2020/0036357 A1 | 1/2020 | Mimura |
| 2020/0083861 A1 | 3/2020 | Matsuo |
| 2020/0083863 A1 | 3/2020 | Makkonen et al. |
| 2020/0177160 A1 | 6/2020 | Jachowski |
| 2020/0235719 A1 | 7/2020 | Yantchev et al. |
| 2020/0259480 A1 | 8/2020 | Pensala |
| 2020/0274520 A1 | 8/2020 | Shin |
| 2020/0313645 A1 | 10/2020 | Caron |
| 2020/0350891 A1 | 11/2020 | Turner |
| 2021/0013859 A1 | 1/2021 | Turner et al. |
| 2021/0119595 A1 | 4/2021 | Turner et al. |
| 2021/0126624 A1 | 4/2021 | Hiramatsu et al. |
| 2021/0152154 A1 | 5/2021 | Tang |
| 2021/0265978 A1 | 8/2021 | Plesski et al. |
| 2021/0328574 A1 | 10/2021 | Garcia |
| 2021/0351762 A1 | 11/2021 | Dyer et al. |
| 2021/0399750 A1 | 12/2021 | Varela Campelo |

FOREIGN PATENT DOCUMENTS

| | | |
|---|---|---|
| CN | 112787614 A | 5/2021 |
| CN | 113839643 A | 12/2021 |
| GB | 2578958 A | 6/2020 |
| WO | 2016017104 | 2/2016 |
| WO | 2018003273 | 1/2018 |
| WO | 2018079522 A1 | 5/2018 |
| WO | 2019241174 A1 | 12/2019 |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).

Buchanan "Ceramic Materials for Electronics" 3rd Edition, first published in 2004 by Marcel Dekker, Inc. pp. 496 (Year 2004). 00 Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Gnewuch, et al. "Broadband monolithic acousto-optic tunable filter", Mar. 1, 2000 / vol. 25, No. 5 / Optics Letters (Year: 2000).

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNbO3 Plate and its Application"; 2014 IEEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

(56) References Cited

OTHER PUBLICATIONS

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 TIBTECH Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Reinhardt, "Acoustic filters based on thin single crystal LiNbQ,3 films: status and prospects", 2014 IEEE International Ultrasonics Symposium Proceedings, pp. 773-781 (Year: 2014).

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pP. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sinha et al., "Slanted finger Inter-digital Transducers for the design of improved performance small shape factor mid- bandwidth SAW filters", IEEE Mtt-S International Microwave and RF Conference, 2013. (Year: 2013).

Sorokin et al.Study of Microwave Acoustic Attenuation in a Multifrequency Bulk Acoustic Resonator Based on a Synthetic Diamond Single CrystalPublished in Acoustical Physics, vol. 61, No. 6, 2015 pP. 675 (Year 2015) 00 Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

World Intellectual Property Organization, International Search Report and Written Opinion for International Application No. PCT/US2022/027796, dated Aug. 17, 2022, 12 total pages. dated Aug. 17, 2022.

World Intellectual Property Organization, International Search Report and Written Opinion for International Application No. PCT/US2022/027798, dated Sep. 6, 2022, 8 total pages. Sep. 6, 2022.

Wu et al., "Frequency band-gap measurement of two-dimensional air/silicon phononic crystals using layered slanted finger interdigital transducers", J. Appl. Phys. 97, 094916, 2005 (Year: 2005).

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, pp. 63 (Year 2015) 00 Jan. 2015.

\* cited by examiner

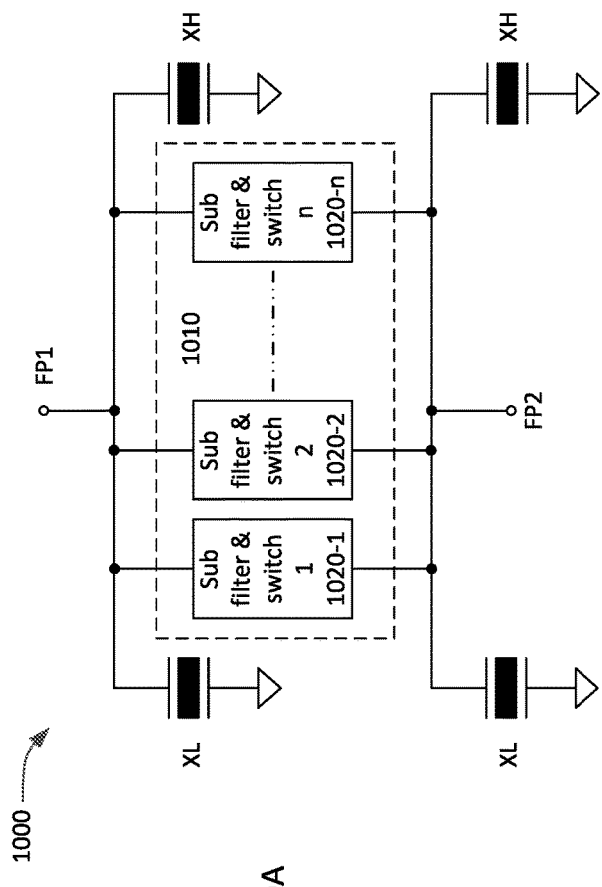
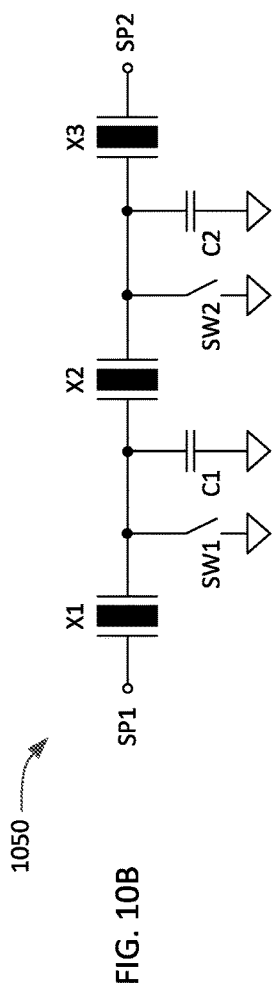
FIG. 10A
FIG. 10B

TRANSVERSELY-EXCITED FILM BULK ACOUSTIC RESONATOR MATRIX FILTERS WITH SWITCHES IN PARALLEL WITH SUB-FILTER SHUNT CAPACITORS

RELATED APPLICATION INFORMATION

This patent is a continuation of Ser. No. 17/373,427, filed Jul. 12, 2021, titled TRANSVERSELY-EXCITED FILM BULK ACOUSTIC RESONATOR MATRIX FILTERS WITH SWITCHES IN PARALLEL WITH SUB-FILTER SHUNT CAPACITORS, which is a continuation-in-part of application Ser. No. 17/372,114, filed Jul. 9, 2021, titled TRANSVERSELY-EXCITED FILM BULK ACOUSTIC RESONATOR MATRIX FILTERS WITH NONCONTIGUOUS PASSBAND, which is claims priority from provisional patent application 63/180,084, filed Apr. 27, 2021, entitled MATRIX FILTER FOR RF DIVERSITY RECEIVER and is a continuation-in-part of application Ser. No. 17/122,986, filed Dec. 15, 2020, titled ACOUSTIC MATRIX DIPLEXERS AND RADIOS USING ACOUSTIC MATRIX DIPLEXERS, which is a continuation-in-part of application Ser. No. 17/121,724, filed Dec. 14, 2020, titled ACOUSTIC MATRIX FILTERS AND RADIOS USING ACOUSTIC MATRIX FILTERS, which claims priority from provisional patent application 63/087,789, filed Oct. 5, 2020, entitled MATRIX XBAR FILTER. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz. Matrix XBAR filters are also suited for frequencies between 1 GHz and 3 GHz.

DESCRIPTION OF THE DRAWINGS

FIG. 10A is a schematic diagram of a reconfigurable switched matrix filter using acoustic resonators.

FIG. 10B is a schematic diagram of a sub-filter and switch module of FIG. 10A.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
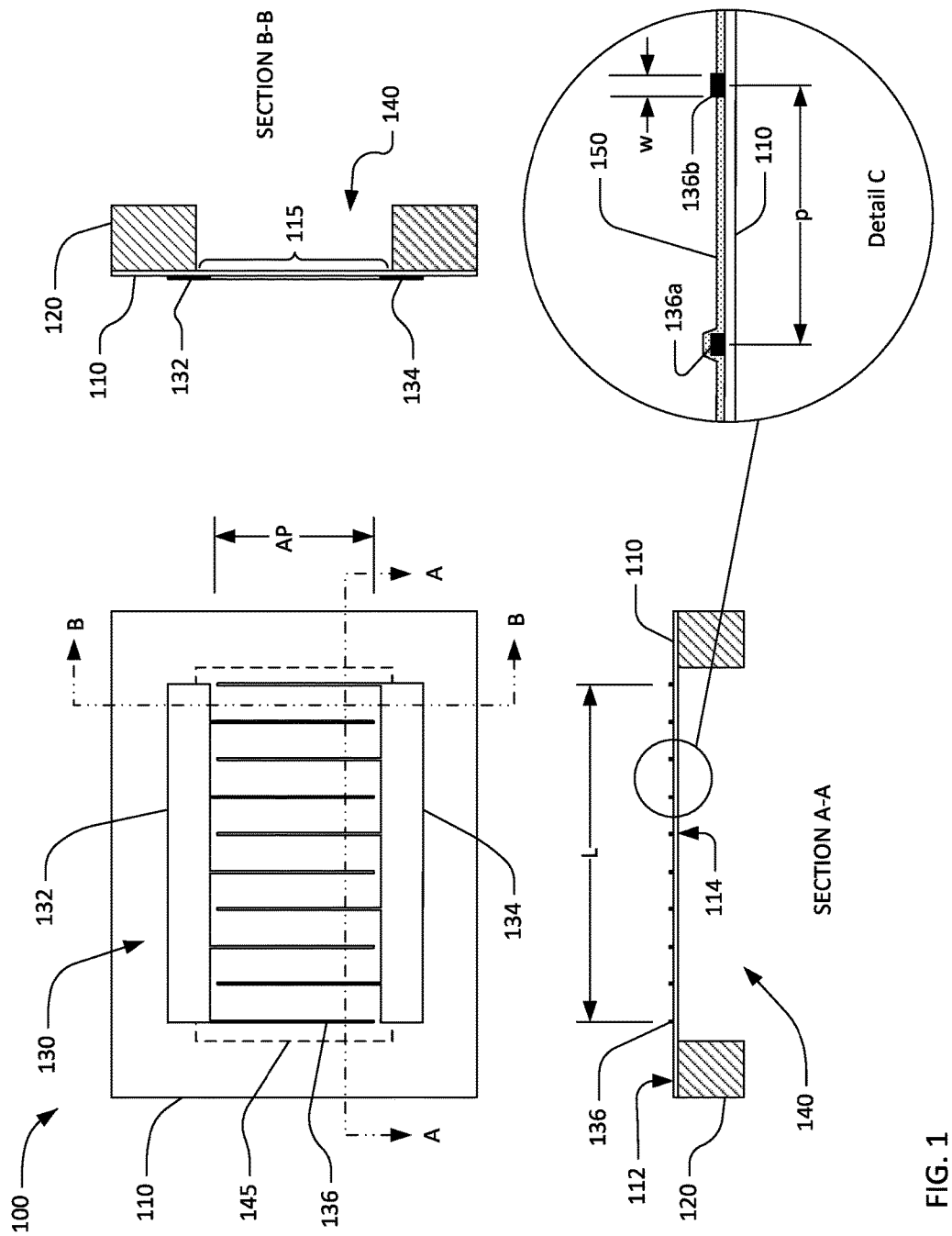
FIG. 1 includes a schematic plan view, two schematic cross-sectional views, and a detailed cross-sectional view of a transversely-excited film bulk acoustic resonator (XBAR).

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz. The matrix XBAR filters described in this patent are also suited for frequencies above 1 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode of an XBAR is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

The detailed cross-section view (Detail C) shows two IDT fingers 136a, 136b on the surface of the piezoelectric plate 110. The dimension p is the "pitch" of the IDT and the dimension w is the width or "mark" of the IDT fingers. A dielectric layer 150 may be formed between and optionally over (see IDT finger 136a) the IDT fingers. The dielectric layer 150 may be a non-piezoelectric dielectric material, such as silicon dioxide or silicon nitride. The dielectric layer 150 may be formed of multiple layers of two or more materials. The IDT fingers 136a and 136b may be aluminum, copper, beryllium, gold, tungsten, molybdenum, alloys and combinations thereof, or some other conductive material. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars of the IDT 130 may be made of the same or different materials as the fingers.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

An XBAR based on shear acoustic wave resonances can achieve better performance than current state-of-the art surface acoustic wave (SAW), film-bulk-acoustic-resonators (FBAR), and solidly-mounted-resonator bulk-acoustic-wave (SMR BAW) devices. In particular, the piezoelectric coupling for shear wave XBAR resonances can be high (>20%) compared to other acoustic resonators. High piezoelectric coupling enables the design and implementation of microwave and millimeter-wave filters of various types with appreciable bandwidth.

Figure 2B:
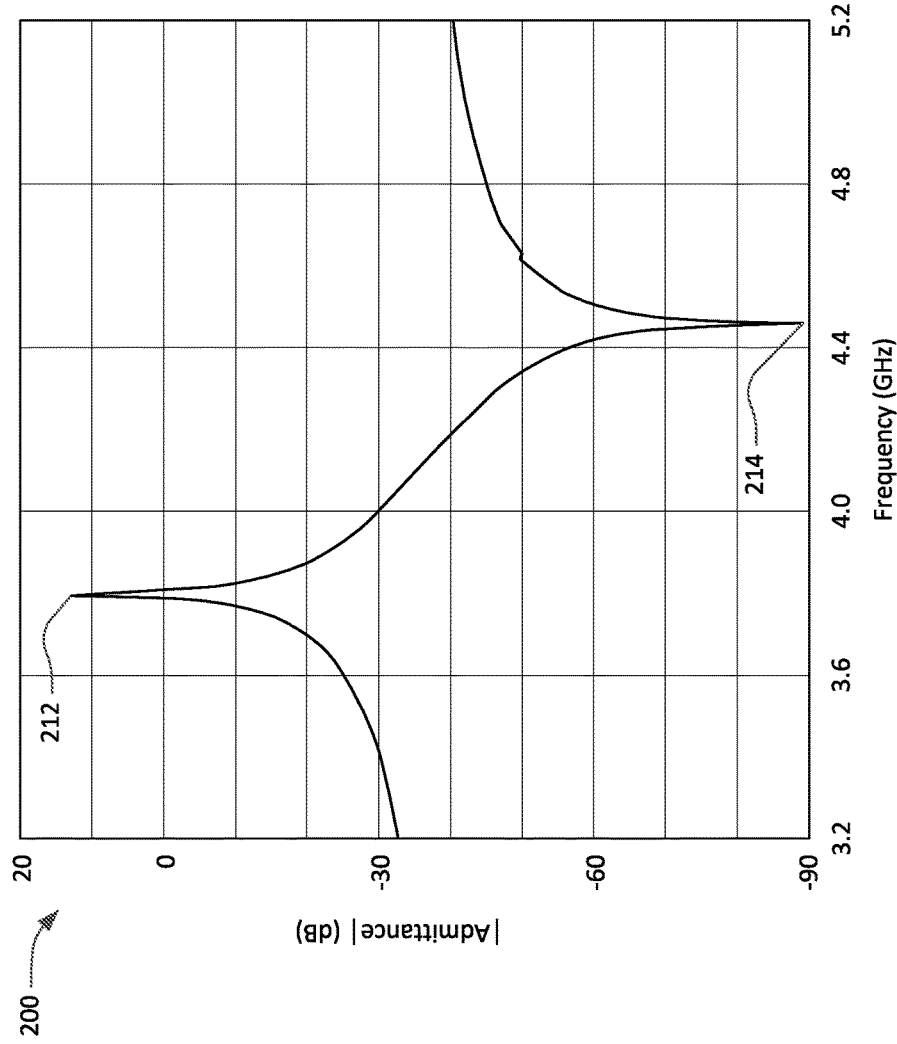
FIG. 2B is a graph of the admittance of an ideal acoustic resonator.
Figure 2A:
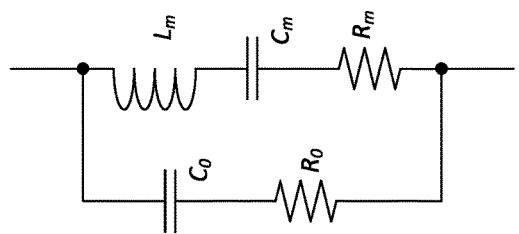
FIG. 2A is an equivalent circuit model of an acoustic resonator.

The basic behavior of acoustic resonators, including XBARs, is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency $F_r$ of the motional resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

where $\gamma = C_0/C_m$ is dependent on the resonator structure and the type and the orientation of the crystalline axes of the piezoelectric material.

FIG. 2B is a graph 200 of the magnitude of admittance of a theoretical lossless acoustic resonator. The acoustic resonator has a resonance 212 at a resonance frequency where the admittance of the resonator approaches infinity. The resonance is due to the series combination of the motional inductance $L_m$ and the motional capacitance $C_m$ in the BVD model of FIG. 2A. The acoustic resonator also exhibits an anti-resonance 214 where the admittance of the resonator approaches zero. The anti-resonance is caused by the combination of the motional inductance $L_m$, the motional capacitance $C_m$, and the static capacitance $C_0$. In a lossless resonator ($R_m=R_0=0$), the frequency $F_r$ of the resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

In over-simplified terms, the lossless acoustic resonator can be considered a short circuit at the resonance frequency 212 and an open circuit at the anti-resonance frequency 214. The resonance and anti-resonance frequencies in FIG. 2B are representative, and an acoustic resonator may be designed for other frequencies.

Figure 2C:
FIG. 2C is a circuit symbol for an acoustic resonator.

FIG. 2C shows the circuit symbol for an acoustic resonator such as an XBAR. This symbol will be used to designate each acoustic resonator in schematic diagrams of filters in subsequent figures.

Figure 3A:
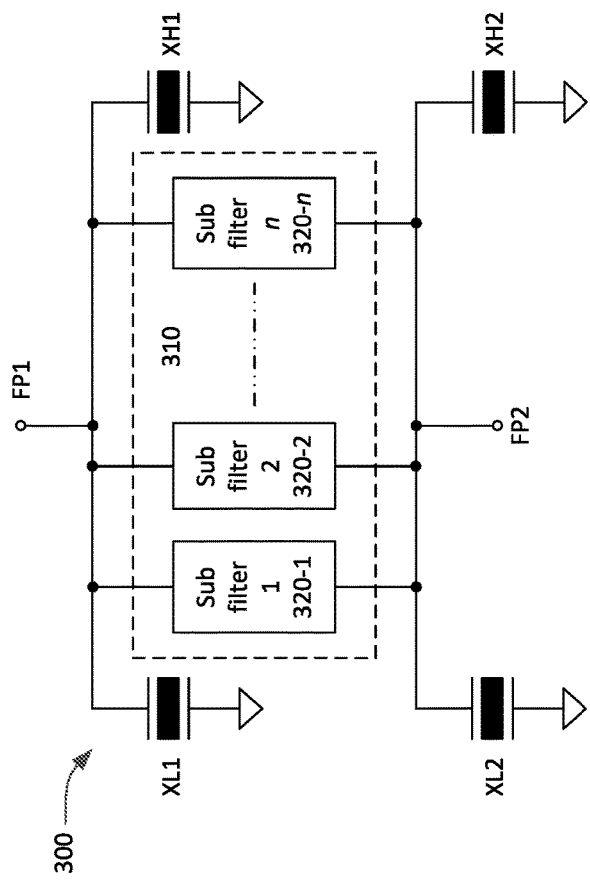
FIG. 3A is a schematic diagram of a matrix filter using acoustic resonators.

FIG. 3A is a schematic diagram of a matrix filter 300 using acoustic resonators. The matrix filter 300 includes an array 310 of n sub-filters 320-1, 320-2, 320-n connected in parallel between a first filter port (FP1) and a second filter port (FP2), where n is an integer greater than one. The sub-filters 320-1, 320-2, 320-n may have contiguous passbands such that the bandwidth of the matrix filter 300 is equal to the sum of the bandwidths of the constituent sub-filters. An example of sub-filters with contiguous passbands is described in U.S. patent application Ser. No. 17/362,727 filed Jun. 29, 2021, entitled TRANSVERSELY-EXCITED FILM BULK ACOUSTIC RESONATOR MATRIX FILTERS WITH SPLIT DIE SUB-FILTERS which is incorporated herein by reference. The sub-filters 320-1, 320-2, 320-*n* may have noncontiguous passbands such that the bandwidth of the matrix filter 300 is not equal to the sum of the bandwidths of the constituent sub-filters, but instead has three separate and independent passbands separated by stop bands that exist where the input-output transfer function of the matrix filter 300 is less than −20 dB. In the subsequent examples in this patent, the sub-filters have non-contiguous passbands and n=3. n can be less than or greater than 3 as necessary to provide the desired non-contiguous passbands for the matrix filter 300. In some cases, the n sub-filters 320-1, 320-2, 320-*n* may include one or more XBARs. The filter 300 and/or sub-filters may be RF filters that pass frequency bands defined by the 5G NR standard.

The array 310 of sub-filters is terminated at the FP1 end by acoustic resonators XL1 and XH1, which are preferably but not necessarily XBARs. The array 310 of sub-filters is terminated at the FP2 end by acoustic resonators XL2 and XH2, which are preferably but not necessarily XBARs. The acoustic resonators XL1, XL2, XH1, and XH2 create "transmission zeros" at their respective resonance frequencies. A "transmission zero" is a frequency where the input-output transfer function of the filter 300 is very low (and would be zero if the acoustic resonators XL1, XL2, XH1, and XH2 were lossless). The zero transmission may be caused by one or more of the acoustic resonators creating a very low impedance to ground and thus, in this configuration cause the sub-filters to be removed as filtering components as the acoustic resonators are basically short circuits to ground so that the sub-filters have no effect on the filter 300 during transmission zero frequencies. Typically, but not necessarily, the resonance frequencies of XL1 and XL2 are equal, and the resonance frequencies of XH1 and XH2 are equal. The resonant frequencies of the acoustic resonators XL1, XL2 are selected to provide transmission zeros adjacent to the lower edge of the filter passband. XL1 and XL2 may be referred to as "low-edge resonators" since their resonant frequencies are proximate the lower edge of the filter passband. The acoustic resonators XL1 and XL2 also act as shunt inductances to help match the impedance at the ports of the filter to a desired impedance value. In the subsequent examples in this patent, the impedance at all ports of the filters is matched to 50 ohms. The impedance may be another value if desired, such as 20, 100 or 1000 ohms. The resonant frequencies of acoustic resonators XH1, XH2 are selected to provide transmission zeros at or above the higher edge of the filter passband. XH1 and XH2 may be referred to as "high-edge resonators" since their resonant frequencies are proximate the higher edge of the filter pas sband. High-edge resonators XH1 and XH2 may not be required in all matrix filters, such as filters that have sub-filters that will not pass a relative amplitude of signals at these high edge frequencies.

Figure 3B:
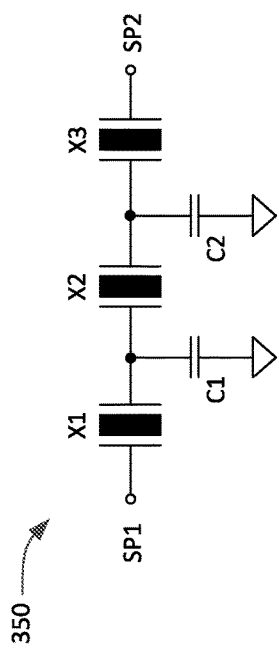
FIG. 3B is a schematic diagram of a sub-filter of FIG. 3A.

FIG. 3B is a schematic diagram of a sub-filter 350 suitable for each of sub-filters 320-1, 320-2, and 320-*n* of filter 300. The sub-filter 350 includes three acoustic resonators XA, XB, XC connected in series between a first sub-filter port (SP1) which can be connected to FP1 and a second sub-filter port (SP2) which can be connected to FP2. The acoustic resonators XA, XB, XC are preferably but not necessarily XBARs. The sub-filter 350 includes two coupling capacitors CA, CB, each of which is connected between ground and a respective node between two of the acoustic resonators. The inclusion of three acoustic resonators in the sub-filter 350 is exemplary. A sub-filter may have m acoustic resonators, where m is an integer greater than one. A sub-filter with m acoustic resonators includes m−1 coupling capacitors. The m acoustic resonators of a sub-filter are connected in series between the two ports SP1 and SP2 of a sub-filter and each of the m−1 coupling capacitors is connected between ground and a node between a respective pair of acoustic resonators from the m acoustic resonators.

Compared to other types of acoustic resonators, XBARs have very high electromechanical coupling (which results in a large difference between the resonance and anti-resonance frequencies), but low capacitance per unit area. The matrix filter architecture, as shown in FIG. 3A and FIG. 3B, takes advantage of the high electromechanical coupling of XBARs without requiring high resonator capacitance.

Figures 4, 5:
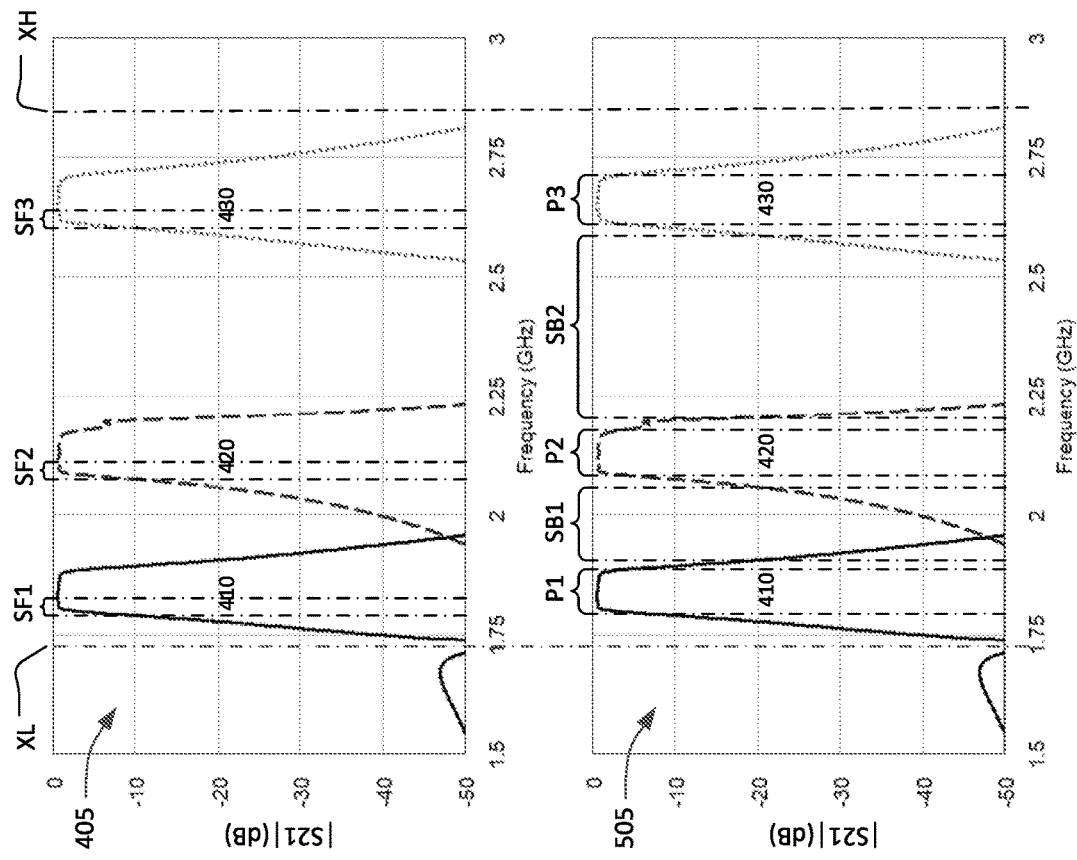
FIG. 4 is a graph of the performance of an embodiment of the filter of FIG. 3A showing resonant frequencies of the sub-filters.
FIG. 5 is the graph of the performance of the embodiment of the filter of FIG. 3A showing passband frequencies of the sub-filters.

FIG. 4 is a graph 400 of the performance 405 of an exemplary embodiment of a matrix filter implemented using XBARs for all of the acoustic resonators. The performance 405 in graph 400 may be performance of the transfer function S21 for filter 300 having 3 non-continuous passband sub-filters 1, 2 and 3. Specifically, performance 405 includes the solid, dashed and dotted lines 410, 420 and 430 that are a plot of S21, the FP1 to FP2 transfer function, of the filter as a function of frequency where each of lines 410, 420 and 430 are for non-continuous passband sub-filters 1, 2 and 3, respectively. That is, the solid line 410 is a plot of S21, the FP1 to FP2 separate transfer function for sub-filter 1 of the filter as a function of frequency and with resonance frequency SF1 in isolation. The dashed line 420 is a plot of S21, the FP1 to FP2 separate transfer function for sub-filter 2 of the filter as a function of frequency and with resonance frequency SF2 in isolation. The dotted line 430 is a plot of S21, the FP1 to FP2 separate transfer function for sub-filter 3 of the filter as a function of frequency and with resonance frequency SF3 in isolation. Since the exemplary filter is symmetrical, the solid, dashed and dotted lines 410, 420 and 430 are also plots of S12.

FIG. 5 is a graph 500 of the passband frequencies of the sub-filters within the exemplary matrix filter of the filter of FIG. 3A whose performance was shown in FIG. 4. The example of graph 500 may be for the receive frequencies of LTE bands 3, 1, and 7 (from low to high frequency) with pass bands defined as above −3 dB. Specifically, P1, P2, and P3 are passband frequencies above −3 dB of the magnitude of the input-output transfer functions for sub-filter 1, sub-filter 2, and sub-filter 3, respectively. Passbands P1, P2, and P3 are noncontiguous because each pair of adjacent passbands is separated by a stop band where the input-output transfer function of the matrix filter is less than −20 dB. For instance, passbands P1 and P2 are noncontiguous because that pair is separated by stop band SB1 that exist where the input-output transfer function S21 of the matrix filter 300 is less than −20 dB. Also, passbands P2 and P3 are noncontiguous because that pair is separated by stop band SB2 that exist where the input-output transfer function S21 of the matrix filter 300 is less than −20 dB. As noted above, this application also considers embodiments where the sub-filters 320-1, 320-2, 320-*n* may have contiguous passbands.

The matrix filter for FIGS. 4 and 5 includes 3 sub-filters with connections between input and output ports that can be switched in and out to provide numerous passbands for input and output RF communication signals. Each sub-filter may include three XBARs, as shown in FIG. 3A and FIG. 3B. In other cases, there may be two, four, five or up to 10 sub-filters. Also, each sub-filter may include more than three XBARs and 2 coupling capacitors. Some sub-filters may have m acoustic resonators where m=four, five, six or up to 10; and a corresponding m−1 coupling capacitors as noted for FIG. 3B. In this example and all subsequent examples, filter performance was determined by simulating the filter using BVD models (FIG. 2A) for the XBARs. It can be appreciated that the concepts herein regarding 3 sub-filters can be expanded to only two or up to four, five or up to an arbitrary number determined by size and routing complexity considerations.

The input-output transfer function of the exemplary filter, as shown in FIG. 4, is the vector sum of the input-output transfer functions of the three sub-filters, where the three sub-filters have noncontiguous passbands. Noncontiguous passbands may mean that no single sub-filter input-output transfer function crosses another sub-filter input-output transfer function at a frequency where both filters S21 transfer functions are above −20 dB. To this end, the input-output transfer functions of sub-filter 1 and sub-filter 2 cross at a frequency just below 2 GHz where (a) S21 of both filters are not above −20 dB and (b) the phases of the input-output transfer functions of both filters are substantially equal. In this context, "not above" means sufficiently below to not cause objectionable variations in either of the transfer functions of a sub-filter due to the transfer function of a different sub-filter of the matrix filter within the filter passband ranges, which is this case is 1.5 to 3 GHz. The quantitative value of "not above" may be different for different filter applications. Similar requirements apply to sub-filter 2 and sub-filter 3. In matrix filters with more than three sub-filters, similar requirements apply to every adjacent (in frequency) pair of sub-filters.

In some cases, a "contiguous" passband matrix filter describes matrix filters having a passband that is the sum of the passbands of more than one sub-filter, while a "noncontiguous" passband matrix filter describes matrix filters where each passband is the passband of only one sub-filter. For some switched matrix filters, the passbands of the sub-filters of a "noncontiguous" are not adjacent or do not overlap above −20 dB. A matrix filter may also have some sub-filters that are contiguous and other sub-filters that are noncontiguous. For example, it may be a filter having at least one stop band between passbands of at least one pair of adjacent sub-filters.

In one example, the lowest passband, noncontiguous passband sub-filter 1, is LTE band Rx 3 and has 3 resonators and 2 coupling capacitors. Here, the middle passband, noncontiguous passband sub-filter 2, is LTE band Rx 1 and has 5 resonators and 4 coupling capacitors. The highest passband, noncontiguous passbands sub-filter 3, is LTE band Rx 7 and sub-filter has 4 resonators and 3 coupling capacitors. This filter may have one or more XL resonators and zero or more XH resonators.

The exemplary matrix filter is symmetrical in that the impedances at Port 1 and Port 2 are both equal to 50 ohms. Matrix filters may also be designed to have significantly different impedances at Port 1 and Port 2, in which event the internal circuitry will not be symmetrical. The vertical dot-dash lines identify the resonance frequencies of the XBARs within the exemplary matrix filter. The line labeled "XL" identifies the resonance frequency of the resonators XL1 and XL2, which is adjacent to the lower edge of the filter passband. Similarly, the line labeled "XH" identifies the resonance frequency of the resonators XH1 and XH2, which is adjacent to the upper edge of the filter passband. The two lines labeled "SF1" in FIG. 4 identify the resonance frequencies of the XBARs within sub-filter 1 in isolation. The two lines labeled "PBF1" in FIG. 5 identify the passband frequencies of the XBARs within sub-filter 1 in isolation. Note that both of the resonance frequencies are lower than the center of the passband. This is because the resonance frequency of a resonator and a capacitor in series is higher that the resonance frequency of the resonator in isolation. Similarly, the two lines labeled "SF2" identify the resonance frequencies of the XBARs within sub-filter 2 and the two lines labeled "SF3" identify the resonance frequencies of the XBARs within sub-filter 3. Similarly, the two lines labeled "SF2" in FIG. 4 identify the resonance frequencies and two lines labeled "PBF2" in FIG. 5 identify the passband frequencies of the XBARs within sub-filter 2. Finally, the two lines labeled "SF3" in FIG. 4 identify the resonance frequencies and two lines labeled "PBF3" in FIG. 5 identify the passband frequencies of the XBARs within sub-filter 3.

Figure 6:
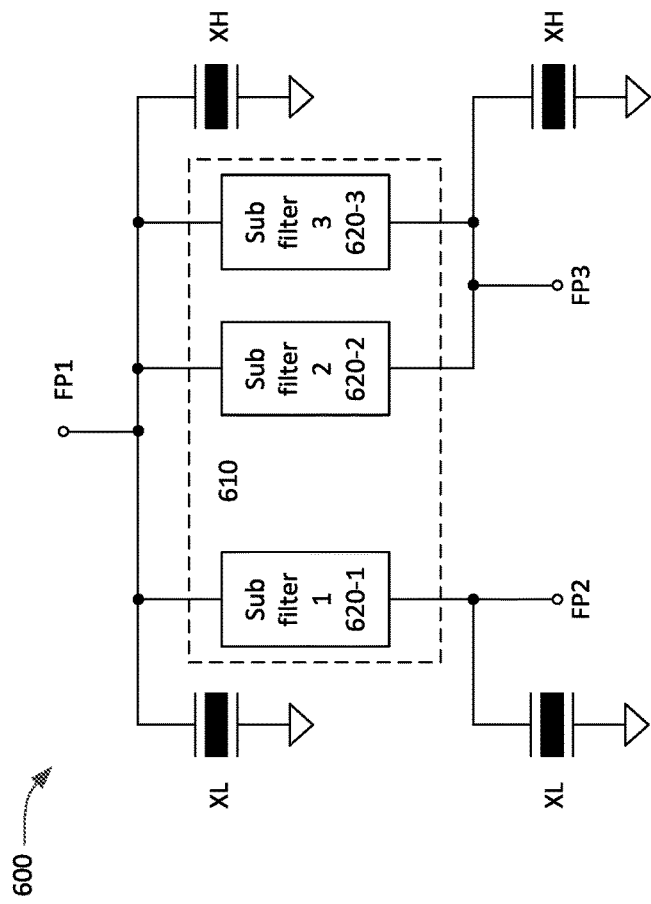
FIG. 6 is a schematic diagram of a matrix diplexer using acoustic resonators.

FIG. 6 is a schematic diagram of a matrix filter 600 configured as a diplexer. The matrix filter 600 includes an array 610 of three sub-filters 620-1, 620-2, 620-n. Sub-filter 1 620-1 is connected between a first filter port (FP1) and a second filter port (FP2). Sub-filter 2 620-2 and sub-filter 3 620-3 are connected in parallel between FP1 and a third filter port (FP3). FP1 is the common or input port of the diplexer and FP2 and FP3 are the branch or output ports. The array 610 of sub-filters is terminated at both ends by XBARs XL and XH as previously described.

Figure 7:
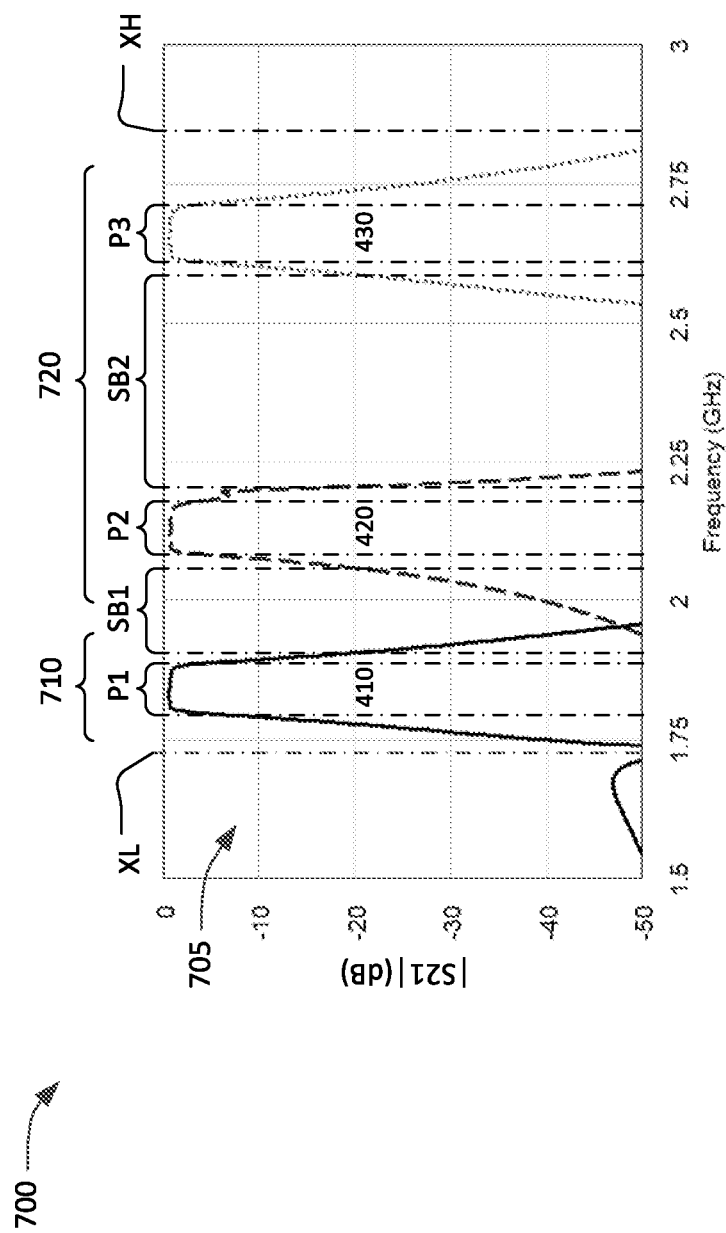
FIG. 7 is a graph of input-output transfer functions of an embodiment of the switched diplexer of FIG. 6.

FIG. 7 is a graph 700 of the performance 705 of an example of the matrix filter diplexer 600 of FIG. 6. In this example, XL, XH, and the three sub-filters are the same as the corresponding elements of the matrix filter 300 of FIG. 3A. In FIG. 7, the solid line 410 under 710 is a plot of S21, the FP1 to FP2 transfer function, as a function of frequency. The dashed line 420 and dotted line 430 under 720 is a plot of S31, the FP1 to FP3 transfer function, as a function of frequency. Since the exemplary filter is symmetrical, the solid line 410 under 710 and the dashed line 420 and dotted line 430 under 720 are also plots of S12 and S13, respectively. The switched matrix filter 600 is exemplary. In most applications, a diplexer will have the same number (two, three or more) sub-filters in parallel between the common port and the two branch ports.

FP1 may be considered the common port of the matrix filter diplexer 600. FP2 may be considered the "low band" port and FP3 may be considered the "high band" port. When the matrix filter diplexer is used in a frequency division duplex radio, one of FP2 and FP3 may be the receive port of the diplexer and the other of FP2 and FP3 may be the transmit port of the diplexer depending on the frequencies allocated for reception and transmission.

In a second diplexer configuration that is a variant of filter 600, sub-filter 1 620-1 and sub-filter 2 620-2 are connected in parallel between FP1 and a FP2. Here, sub-filter 3 620-3 is connected between a FP1 and a FP3. In this case, a graph of the performance of an example of the matrix filter diplexer has the solid line 410 and dashed line 420 as a plot of S21; and the dotted line 430 as a plot of S31, as a function of frequency.

In a third diplexer configuration that is a variant of filter 600, sub-filter 1 620-1 and sub-filter 3 620-3 are connected in parallel between FP1 and FP2. Here, sub-filter 2 620-2 is connected between FP1 and FP3. In this case, a graph of the performance of an example of the switched matrix filter diplexer has the solid line 410 and dotted line 430 as a plot of S21; and the dashed line 420 as a plot of S31, as a function of frequency.

The diplexer sfilter 600 and two variants are switched matrix filters because any one of the branch ports FP2 or FP3 may be selected or switched to as an output for the filter. For example, the sub-filters connections between input and output ports can be switched in and out to provide numerous passbands for input and output RF communication signals.

Figure 8:
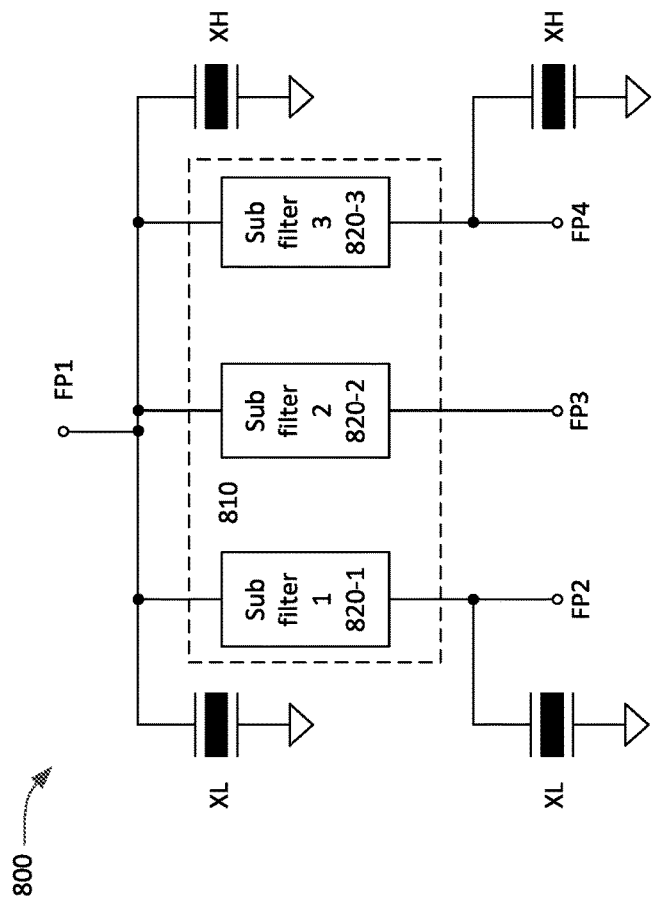
FIG. 8 is a schematic diagram of a matrix triplexer using acoustic resonators.

FIG. 8 is a schematic diagram of a matrix triplexer filter 800 using acoustic resonators. The matrix filter 800 includes an array 810 of three sub-filters 820-1, 820-2, 820-n. Sub-filter 1 820-1 is connected between a first filter port (FP1) and a second filter port (FP2). Sub-filter 2 820-2 is connected between FP1 and a third filter port (FP3). Sub-filter 3 820-3 is connected between FP1 and a fourth filter port (FP4). The array 810 of sub-filters is terminated at both ends by XBARs XL and XH as previously described. FP1 is the common or input port of the multiplexer and FP2, FP3, and FP4 are branch or output ports of the multiplexer. A multiplexer may have more than three branch ports. A multiplexer with two branch ports is commonly referred to as a "diplexer" and a multiplexer with three branch ports may be referred to as a "triplexer".

Figure 9:
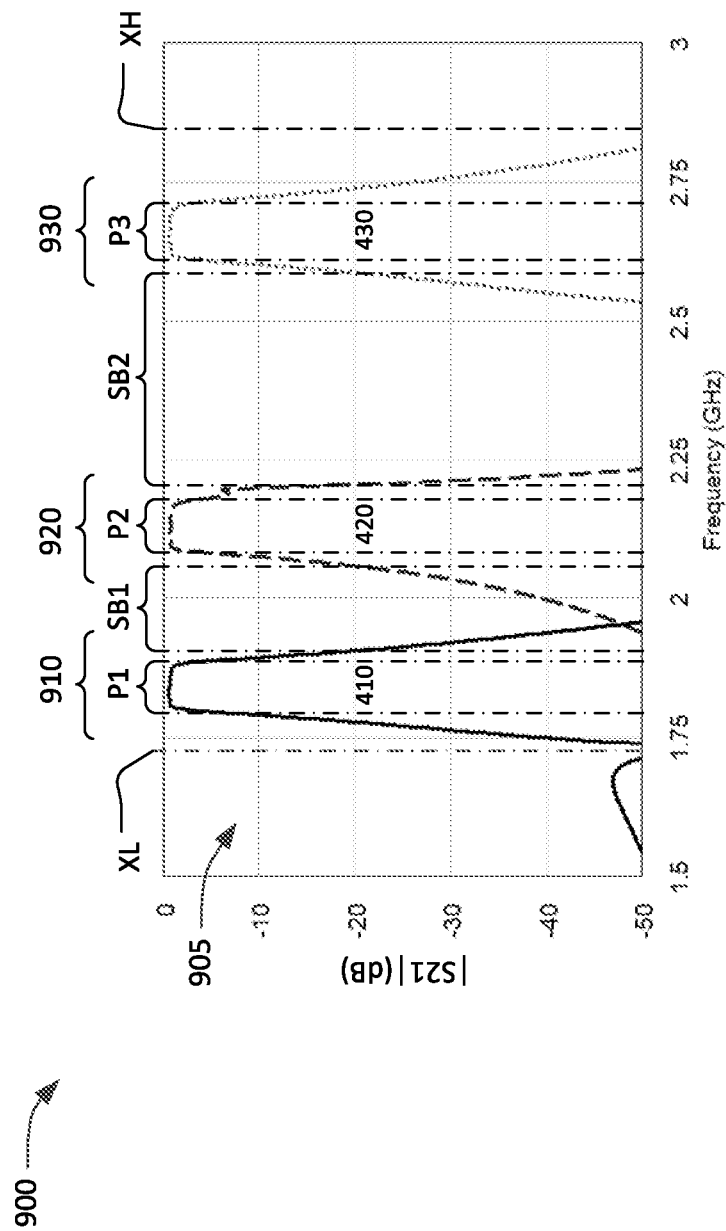
FIG. 9 is a graph of input-output transfer functions of an embodiment of the triplexer of FIG. 8.

FIG. 9 is a graph 900 of the performance of an example of the functions of an embodiment of the triplexer filter 800 of FIG. 8. In this example, XL, XH, and the three sub-filters are the same as the corresponding elements of the matrix filter 300 of FIG. 3A. In FIG. 9, the solid line under 910 is a plot of S21, the FP1 to FP2 transfer function, as a function of frequency. The dashed line under 920 is a plot of S31, the FP1 to FP3 transfer function, as a function of frequency. The dotted line under 930 is a plot of S41, the FP1 to FP4 transfer function, as a function of frequency. Since the exemplary filter is symmetrical, the solid line under 910, the dashed line under 920, and the dotted line under 930 are also plots of S12, S13 and S14, respectively.

FP1 may be considered the common port of the matrix filter. FP2 may be considered the "low band" port, FP3 may be considered the "middle band" port and FP4 may be considered the "high band" port. When the matrix filter is used in a frequency division duplex (FDD) radio, one of FP2, FP3 and FP4 may be the receive port and another of FP2, FP3 and FP4 may be the transmit port depending on the frequencies allocated for reception and transmission. In other cases, in a FDD radio, two of FP2, FP3 and FP4 may be the receive port and the other of FP2, FP3 and FP4 may be the transmit port; or vice versa.

In additional multiplexer configurations that are variants of filter 800, any one or more of sub-filter 1 820-1, sub-filter 2 820-2, and sub-filter 3 820-3 may be connected in parallel between FP1 and FP2, FP3 and/or FP4. In this case, a graph of the performance of an example of the matrix filter diplexer has the corresponding ones of the solid, dashed and dotted lines 410, 420 and/or 430 as a plot of S21, S31 and/or S41, as a function of frequency.

The multiplexer filter 800 and two variants may be switched matrix filters because any one or more of the ports FP2, FP3 and FP4 may be selected or switched to as an output for the filter. For example, the sub-filters connections between input and output ports can be switched in and out to provide numerous passbands for input and output RF communication signals. In one example, a switched XBAR matrix filter having 3 sub-filters for LTE bands 3, 1, and 7 provides a multi-passband reconfigurable filter that is configurable for all 7 possible states: only 1, only 3, only 7, 1+3, 1+7, 3+7, and 1+3+7. This filter has low loss due to its matrix architecture, such as due to the location of the switches and due to the filter not needing inductors. This filter also has output impedance matched to LNA, so that there is no external impedance matching required.

For example, FIG. 10A is a schematic diagram of a reconfigurable switched matrix filter 1000 using XBARs. The reconfigurable switched matrix filter 1000 includes an array 1010 of n sub-filter/switch circuits 1020-1, 1020-2, 1020-n connected in parallel between a first filter port (FP1) and a second filter port (FP2), where n is an integer greater than one. In a subsequent example, n=3. In other cases, n can be greater than 3 as necessary to provide the desired bandwidth for the reconfigurable matrix filter 1000. Each sub-filter/switch circuit functions as a noncontiguous bandpass filter that can be selectively enabled (i.e. connected between FP1 and FP2) or disabled (i.e. not connected between FP1 and FP2). The array 1010 of sub-filter/switch circuits is terminated at both ends by XBARs XL and XH as previously described.

The sub-filter/switch circuits 1020-1, 1020-2, 1020-n have noncontiguous passbands such that the bandwidth of the matrix filter 1000, when all sub-filter/switch modules are enabled, is not equal to the sum of the bandwidths of the constituent sub-filters, but instead has three separate and independent passbands separated by stop bands that exist where the input-output transfer function of the matrix filter 300 is less than −20 dB. One or more of the sub-filter/switch circuits can be disabled to tailor the matrix filter bandwidth or to insert notches or stop bands within the overall passband, such as to provide the desired noncontiguous passbands for the matrix filter. The filter 1000 and/or sub-filters may be RF filters that pass frequency bands defined by the 5G NR standard.

FIG. 10B is a schematic diagram of a sub-filter/switch circuit 1050 suitable for sub-filter/switch circuits 1020-1, 1020-2, and 1020-n in FIG. 10A. The sub-filter/switch circuit 1050 includes three acoustic resonators X1, X2, X3 in series between a first sub-filter port (SP1) and a second sub-filter port (SP2), and coupling capacitors C1, C2 connected from the junctions between adjacent acoustic resonators to ground. The inclusion of three acoustic resonators in the sub-filter/switch circuit 1050 is exemplary, and a sub-filter/switch circuit may have more than three acoustic resonators. When a sub-filter/switch circuit includes more than three acoustic resonators, the number of coupling capacitors will be one less than the number of acoustic resonators. The acoustic resonators X1, X2, X3 are preferably but not necessarily XBARs.

The sub-filter/switch circuit 1050 includes a switch SW1 in parallel with the first shunt capacitor C1 and a switch SW2 in parallel with the last shunt capacitor C2. When the switches SW1 and SW2 are open, the sub-filter/switch circuit operates as a sub-filter suitable for use in any of the prior examples. In this case, the sub-filter/switch circuit connection between input and output ports is switched in to provide the passband of that sub-filter for input and output RF communication signals. When the switches SW1 and SW2 are closed, the sub-filter/switch circuit presents the proper impedance to SP1 and SP2 but has the input-output transfer function of an open circuit. In this case, the sub-filter/switch circuit connection between input and output ports is switched out and does not provide the passband of that sub-filter for input and output RF communication signals.

When a sub-filter/switch circuit includes more than two shunt capacitors, the switches are in parallel with the two shunt capacitors immediately adjacent to the acoustic resonators connected to the two sub-filter ports. In other words, the switches are in parallel with the "first shunt capacitor" and the "last shunt capacitor" that are not in the middle of the string of resonators, but are just inside of the two "end acoustic resonators" at the ends of the string. In some cases, filter 1000 may be described has having respective output ports SP2 of all of its sub-filters connected to a common output port FP2. For example, the first switch is in parallel with the first capacitor shunt element that is between an XBAR series element that is immediately adjacent to the filter input port and an XBAR series element that is farther from the input port; and the second switch is in parallel wherein the last capacitor shunt element that is between an XBAR series element that is immediately adjacent to the filter output port and an XBAR series element that is farther from the output port.

Figure 11:
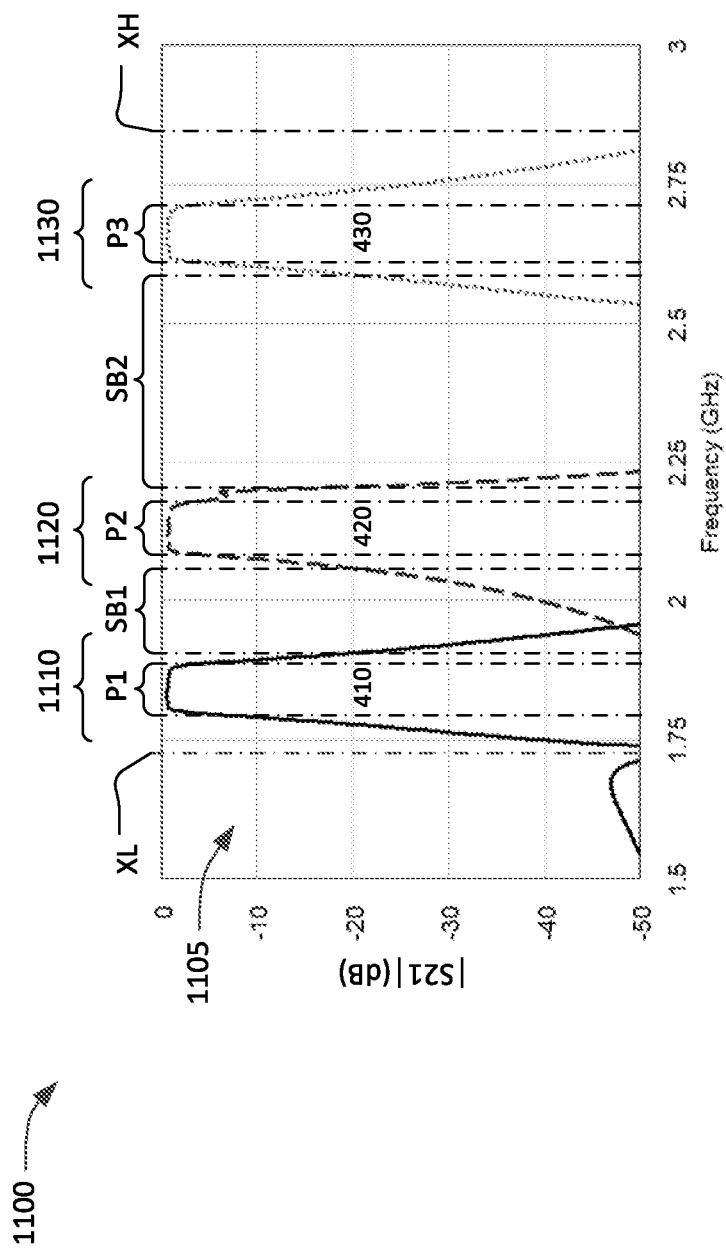
FIG. 11 is a graph of input-output transfer functions of two configurations of an embodiment of the reconfigurable switched matrix filter of FIG. 10A.

FIG. 11 is a graph 1100 of the performance 1105 of an example of the reconfigurable switched matrix filter diplexer 1000 of FIG. 10. In this example, XL, XH, and the components within the three sub-filter/switch circuits are the same as the corresponding elements of the matrix filter 300 of FIG. 3A. In FIG. 11, the solid line under 1110 is a plot of S21, the port 1 to port 2 transfer function, of the filter as a function of frequency when sub-filter/switch circuit 1 is enabled and sub-filter/switch circuit 2 and 3 are disabled. The dashed line under 1120 is a plot of S21 as a function of frequency when sub-filter/switch circuit 2 is enabled and sub-filter/switch circuit 1 and 3 are disabled. The dashed line under 1130 is a plot of S21 as a function of frequency when sub-filter/switch circuit 3 is enabled and sub-filter/switch circuit 1 and 2 are disabled. The sum of the two curves under 1110 and 1130, not shown but easily envisioned, is the port 1 to port 2 transfer function as a function of frequency when sub-filter/switch circuits 1 and 3 are enabled and sub-filter/switch circuit 2 is disabled. The sum of the two curves under 1110 and 1120, is the port 1 to port 2 transfer function as a function of frequency when sub-filter/switch circuits 1 and 2 are enabled and sub-filter/switch circuit 3 is disabled. The sum of the two curves under 1110 and 1130, is the port 1 to port 2 transfer function as a function of frequency when sub-filter/switch circuits 1 and 3 are enabled and sub-filter/switch circuit 2 is disabled. The sum of the two curves under 1120 and 1130, is the port 1 to port 2 transfer function as a function of frequency when sub-filter/switch circuits 2 and 3 are enabled and sub-filter/switch circuit 1 is disabled. The sum of the three curves under 1110, 1120 and 1130, is the port 1 to port 2 transfer function as a function of frequency when sub-filter/switch circuits 1, 2 and 3 are enabled. The input-output transfer function of an open circuit is the port 1 to port 2 transfer function as a function of frequency when all of the sub-filter/switch circuits 1, 2 and 3 are disabled. A total of eight different filter configurations are possible by enabling various combinations of the three sub-filter/switch circuits.

Figure 12:
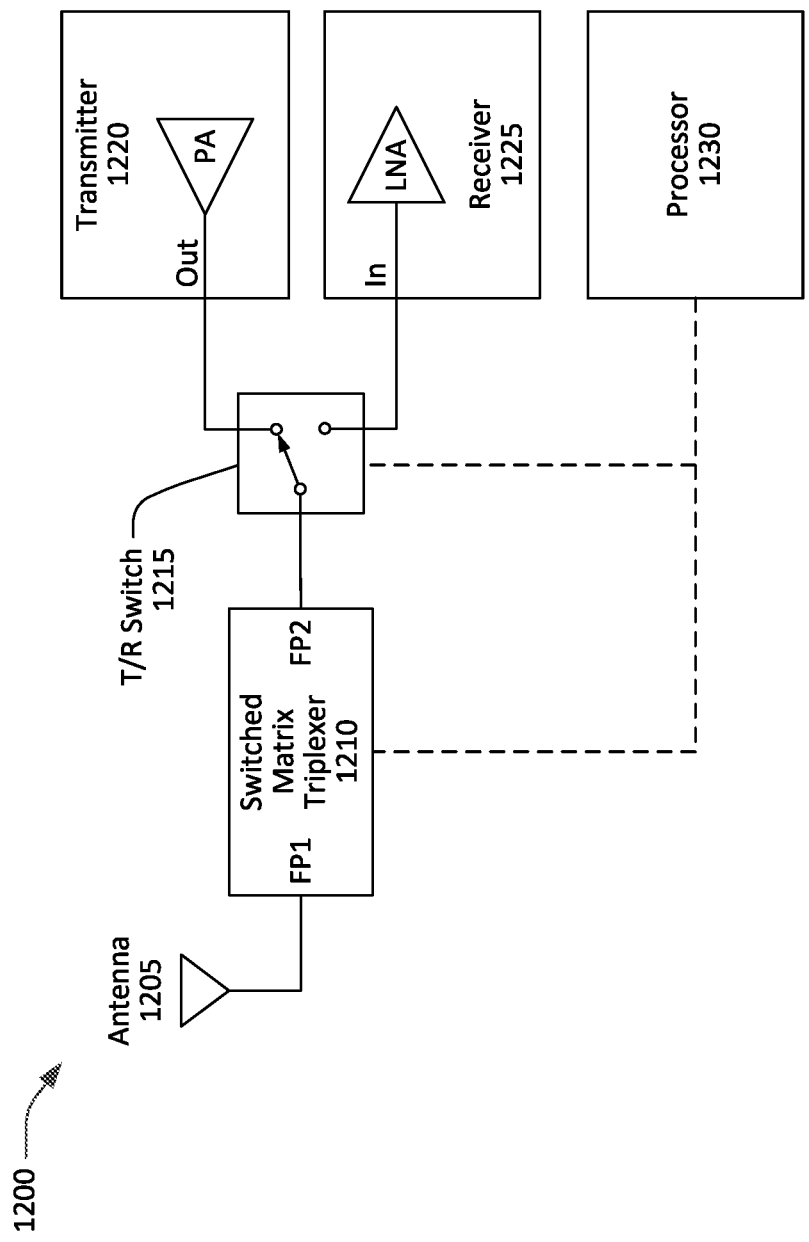
FIG. 12 is a block diagram of a three-band time division duplex radio using a switched matrix triplexer.

FIG. 12 is a schematic block diagram of a three-band time division duplex (TDD) radio 1200 using a switched matrix triplexer. A TDD radio transmits and receives in the same frequency channel within a designated communications band. The radio 1200 includes a switched matrix triplexer 1210 having a first filter port FP1 configured to connect to an antenna 1205 and a second filter port FP2 coupled to a transmit/receive (T/R) switch 1215. The switched matrix bandpass filter 1210 may be, for example, the switched matrix bandpass filter of FIG. 10A. The T/R switch 1215 connects the second port of the matrix bandpass filter 1210 to either the output of a transmitter 1220 or the input of a receiver 1225. The T/R switch 1215, the transmitter 1220, and the receiver 1225 are supervised by a processor 1230 performing a media access control function. Specifically, the processor 1230 controls the operation of the T/R switch 1215 and, the switched matrix bandpass filter 1210. When the switched matrix bandpass filter 1210 is reconfigurable, the processor 1230 may control the operation of switches within the bandpass filter. The antenna 1205 may be a part of the radio 1200 or external to the radio 1200.

The radio 1200 is configured for operation in three designated communications bands. The switched matrix bandpass filter 1210 has internal switches that allow selection of one of three passbands that encompasses the designated communications bands and one or more stop bands to block designated frequencies outside of the designated communications bands. Preferably, the switched bandpass filter 1210 has low loss in its passbands and high rejection in its stop band(s). Further, the switched bandpass filter 1210 must be compatible with TDD operation, which is to say stable and reliable while passing the RF power generated by the transmitter 1220. The switched matrix bandpass filter 1210 may be the switched matrix filter 300 of FIG. 3A or the reconfigurable switched matrix filter 1000 of FIG. 10A implemented using acoustic resonators which may be XBARs.

The switched matrix bandpass filter 1210 may be a reconfigurable matrix filter as shown in FIG. 10A. The use of a reconfigurable filter would allow the bandwidth of the filter to be set to a single LTE or 5G NR band, allowing the same transmitter and receiver to be used for three separate bands. The switches within the sub-filters may be controlled by the processor 1230.

Figure 13:
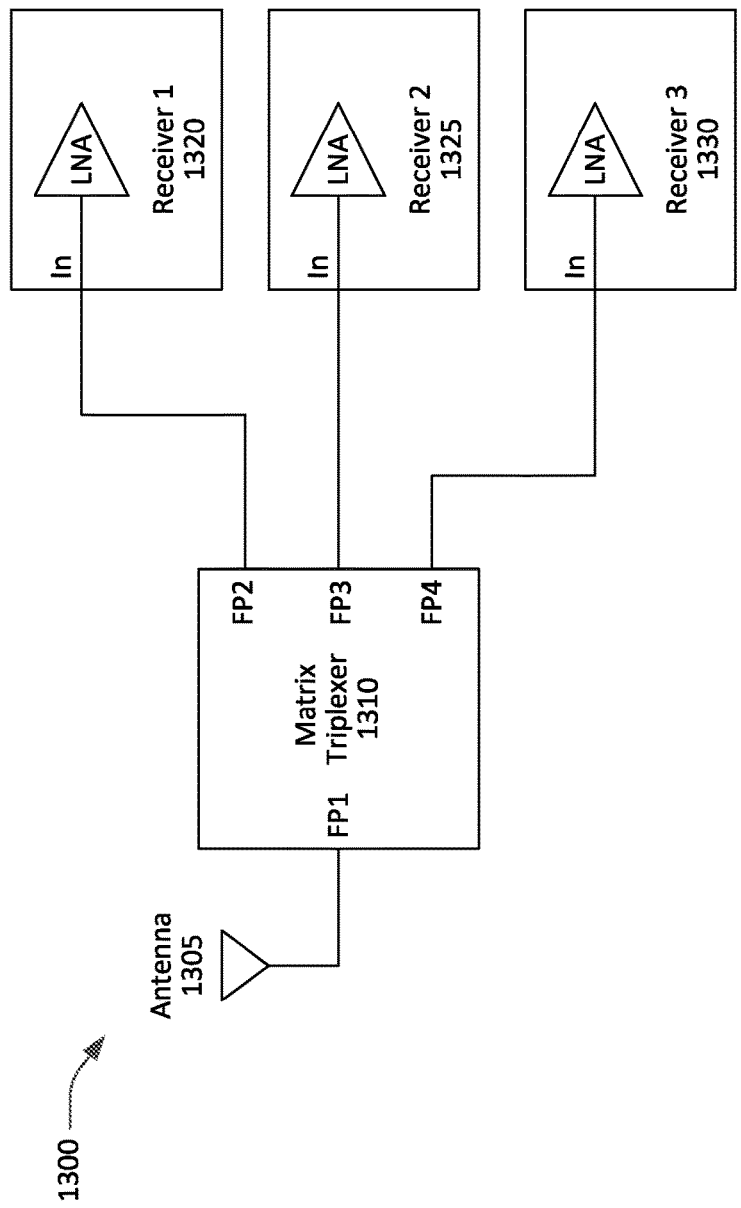
FIG. 13 is a block diagram of a three-band diversity receiver using a matrix triplexer.

FIG. 13 is a schematic block diagram of a three-band diversity receiver 1300 using a matrix triplexer. A three-band diversity receiver radio receives in three different frequency ranges corresponding to three communications band. The receiver 1300 includes an antenna 1305, a matrix filter triplexer 1310 having a common filter port FP1 configured to connect to an antenna 1305, a first receiver filter port FP2 coupled to the input of a receiver 1320, a second receiver filter port FP3 coupled to the input of a receiver 1325, and a third receive filter port FP4 coupled to the input of a receiver 1330.

The receiver 1300 is configured for operation in the designated communications band. The matrix filter triplexer 1310 includes a receive filter coupled between each of: FP1 and FP2; FP1 and FP3; and FP1 and F4. The receive filter includes noncontiguous passband receive sub-filters. The matrix filter triplexer 1310 may be implemented using acoustic resonators which may be XBARs.

The matrix filter diplexer 1310 may be the matrix triplexer 800 of FIG. 8. The FP1, FP2, FP3 and FP4 ports of the matrix filter diplexer 1310 may be the FP1, FP2, FP3 and FP4 ports of the matrix multiplexer 800.

In another case, the matrix filter diplexer 1310 may be similar to the reconfigurable switched filter 1000 of FIG. 10A with an equal number of sub-filters in the transmit and receive filters. The FP1 port of the matrix filter diplexer 1310 may be FP1 of the reconfigurable switched filter 1000; and the FP2, FP3 and FP4 ports of the matrix filter diplexer 1310 may be FP2 of the reconfigurable switched filter 1000.

The acoustic resonator matrix filter topologies herein, such as of filter 300, 600, 800 and/or 1000, may reduce the size of resonators in the filters, thus: lowering the cost of components for and of manufacturing of the filters; provide filter with passbands that are very insensitive to switch loss; provide filters having achievable impedance transformation for matching impedance at the input and output of the filter; and provide filters that are matched to the minimum noise figure of output connected LNAs without any matching inductor. These topologies allow switching in and out of multiple passbands for input and output RF communication signals without requiring inductors, such as between the coupling capacitors and ground, In one example, an XBAR matrix filter having 3 sub-filters for LTE bands 3, 1, and 7 provides a multi-passband reconfigurable filter that is configurable for all 7 possible states: only 1, only 3, only 7, 1+3, 1+7, 3+7, and 1+3+7. This filter has low loss due to its matrix architecture, such as due to the location of the switches and due to the filter not needing inductors. This filter also has output impedance matched to LNA, so that there is no external impedance matching required.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A matrix filter, comprising:
a filter input port; and
two or more sub-filters connected between the filter input port and respective filter output ports, each sub-filter comprising n transversely-excited film bulk acoustic resonator (XBAR) series elements and at least one capacitor shunt element,
wherein n is an integer greater than 2, and
wherein each sub-filter further comprises at least one switch in parallel with the at least one capacitor shunt element.

2. The filter of claim 1, wherein the two or more sub-filters have noncontiguous passbands[HL and wherein each of the noncontiguous passbands is a passband of only one sub-filter of the two or more sub-filters.

3. The filter of claim 2, wherein the two or more sub-filters have contiguous passbands.

4. The filter of claim 1, wherein only one sub-filter of the two or more sub-filters is selected to be connected between the filter input port and at least one filter output port of the respective filter output ports, and wherein no single sub-filter of the two or more sub-filters has an input-output transfer function that crosses an input-output transfer function of any other single sub-filter of the two or more sub-filters at a frequency where both respective input-output transfer functions are above −20 dB.

5. The filter of claim 1, wherein each of the two or more sub-filters have noncontiguous passbands separated by a stop band that exists where an input-output transfer function of the matrix filter is less than −20 dB; and wherein sub-filter connections between the filter input port and the respective filter output ports is configured to be switched to select one or more of the noncontiguous passbands.

6. The filter of claim 1, wherein the at least one capacitor shunt element is between one of:
a) an XBAR series element of the n XBAR series elements that is immediately adjacent to the filter input port and an XBAR series element of the n XBAR series elements that is farther from the filter input port; or
b) an XBAR series element of the n XBAR series elements that is immediately adjacent to a filter output port of the respective filter output ports and an XBAR series element of the n XBAR series elements that is farther from the filter output port of the respective filter output ports.

7. The filter of claim 6, wherein the n XBAR series elements include a first end XBAR connected to a first sub-filter port, a second end XBAR connected to a second sub-filter port, and one or more middle XBARs connected between the first end XBAR and the second end XBAR.

8. The filter of claim 1, wherein each of the respective filter output ports is connected to a common output port.

9. The filter of claim 1, wherein:
each of the XBAR series elements is connected in series between a first sub-filter port and a second sub-filter port;
each of the at least one capacitor shunt element is connected between ground and a node between a respective pair of XBAR series elements of the n XBAR series elements; and
each of the at least one switches is connected between ground and the node between the respective pair of XBAR series elements of then XBAR series elements.

10. A filter, comprising:
a first filter port and a second filter port; and
n sub-filters, where n is an integer greater than one, each of the n sub-filters having a first sub-filter port connected to the first filter port and a second sub-filter port connected to the second filter port;
wherein each sub-filter comprises at least three transversely-excited film bulk acoustic resonator (XBAR) series elements and at least one capacitor shunt element;
wherein each of the n sub-filters further comprise at least one switch in parallel with the at least one capacitor shunt element.

11. The filter of claim 10, wherein the n sub-filters have noncontiguous passbands, and wherein each of the noncontiguous passbands is the passband of only one sub-filter of the n sub-filters.

12. The filter of claim 10, wherein each of the n sub-filters has a noncontiguous passband separated from the passband of all of the other n sub-filters by a stop band that exists where an input-output transfer function of the filter is less than −20 dB.

13. The filter of claim 10, wherein only one sub-filter of the n sub-filters is selected to be connected between the first filter port and the second filter port, and wherein no single sub-filter of the n sub-filters has an input-output transfer function that crosses an input-output transfer function of any other single sub-filter of the n sub-filters at a frequency where both respective input-output transfer functions are above −20 dB.

14. The filter of claim 10, wherein the passband of the filter is selected to be equal to only one of the noncontiguous passbands of the n sub-filters.

15. The filter of claim 10, wherein:
each of the XBAR series elements is connected in series between the first sub-filter port and the second sub-filter port;
each of the at least one capacitor shunt element is connected between ground and a node between a respective pair of XBAR series elements of the at least three XBAR series elements; and
each of the at least one switches is connected between ground and the node between the respective pair of XBAR series elements of the at least three XBAR series elements.

16. The filter of claim 15, wherein:
the XBAR series elements each include a first end XBAR connected to the first sub-filter port, a second end XBAR connected to the second sub-filter port, and one or more middle XBARs connected between the first end XBAR and the second end XBAR, and
the at least one capacitor shunt element is between one of:
 a) an XBAR series element of the XBAR series elements that is immediately adjacent to the first sub-filter port and an XBAR series element of the XBAR series elements that is farther from the first sub-filter port; or
 b) an XBAR series element of the XBAR series elements that is immediately adjacent to the second sub-filter port and an XBAR series element of the XBAR series elements that is farther from the second sub-filter port.

17. A three-band diversity receiver, comprising:
a matrix triplexer coupled between an antenna and three receivers, the triplexer comprising;
 a first sub-filter coupled between a first filter port and a second filter port coupled to a first receiver of the three receivers;
 a second sub-filter coupled between the first filter port and a third filter port coupled to a second receiver of the three receivers;
 a third sub-filter coupled between the first filter port and a fourth filter port coupled to a third receiver of the three receivers;
 wherein each sub-filter comprises at least three transversely-excited film bulk acoustic resonator (XBAR) series elements and at least one capacitor shunt element;
wherein each sub-filter further comprises at least one switch in parallel with the at least one capacitor shunt element.

18. The filter of claim 17, wherein the first, second and third sub-filters each have a noncontiguous passband separated from the passband of all of the others of the first, second and third sub-filters by a stop band that exists where an input-output transfer function of the matrix triplexer is less than −20 dB.

19. The filter of claim 17, wherein:
each of the XBAR series elements is connected in series between the first sub-filter port and the second sub-filter port;
each of the at least one capacitor shunt element is connected between ground and a node between a respective pair of XBAR series elements of the at least three XBAR series elements; and
each of the at least one switches is connected between ground and the node between the respective pair of XBAR series elements of the at least three XBAR series elements.

20. The filter of claim 17, wherein the first, second and third sub-filters have contiguous passbands.

* * * * *